United States Patent
Hsu et al.

(10) Patent No.: US 8,261,223 B2
(45) Date of Patent: Sep. 4, 2012

(54) HIERARCHY-BASED ANALYTICAL PLACEMENT METHOD CAPABLE OF MACRO ROTATION WITHIN AN INTEGRATED CIRCUIT

(75) Inventors: Meng-Kai Hsu, New Taipei (TW); Yao-Wen Chang, Taipei (TW); Tung-Chieh Chen, Taipei (TW)

(73) Assignees: Springsoft Inc., Hsinchu (TW); Springsoft USA, Inc., San Jose, CA (US)

( * ) Notice: Subject to any disclaimer, the term of this patent is extended or adjusted under 35 U.S.C. 154(b) by 25 days.

(21) Appl. No.: 13/093,814

(22) Filed: Apr. 25, 2011

(65) Prior Publication Data

US 2011/0202897 A1    Aug. 18, 2011

Related U.S. Application Data

(63) Continuation-in-part of application No. 12/168,288, filed on Jul. 7, 2008, now Pat. No. 7,984,410.

(60) Provisional application No. 61/354,719, filed on Jun. 15, 2010.

(51) Int. Cl.
*G06F 17/50* (2006.01)
*G06F 9/455* (2006.01)

(52) U.S. Cl. ........ 716/119; 716/118; 716/122; 716/123; 716/124; 716/125; 716/132; 716/135

(58) Field of Classification Search .......... 716/118–119, 716/122–125, 132, 135
See application file for complete search history.

(56) References Cited

U.S. PATENT DOCUMENTS

| | | | |
|---|---|---|---|
| 6,282,693 B1 | 8/2001 | Naylor et al. | |
| 2003/0196183 A1* | 10/2003 | Alpert et al. | 716/10 |
| 2006/0190889 A1* | 8/2006 | Cong et al. | 716/8 |
| 2007/0157146 A1* | 7/2007 | Chen et al. | 716/10 |

* cited by examiner

*Primary Examiner* — Stacy Whitmore
(74) *Attorney, Agent, or Firm* — Litron Patent and Trademark Office

(57) ABSTRACT

A placer produces a global placement plan specifying positions of cell instances and orientations of macros within an integrated circuit (IC) by initially clusterizing cell instances and macros to form a pyramidal hierarchy of blocks. Then the placer iteratively repeats the declusterization and routability improvement process from the highest level to the lowest level of the hierarchy. An objective function is provided in Cartesian coordinate for representing the position of each movable instance and in polar coordinate for representing the orientation of a macro relative to its the center. For each movable instance and each rotatable macro, its position or orientation is determined by conjugate gradient method to minimize total wire length. Finally, the placer uses a look-ahead legalization technique to rotate rotatable macros to legal orientations and move cell instances to legal positions in the end of global placement.

20 Claims, 11 Drawing Sheets

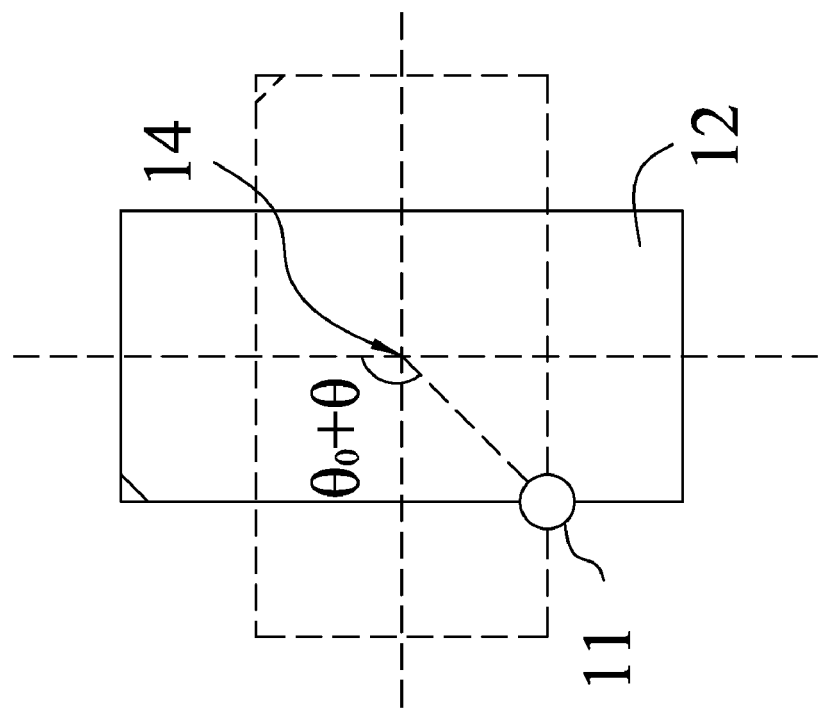
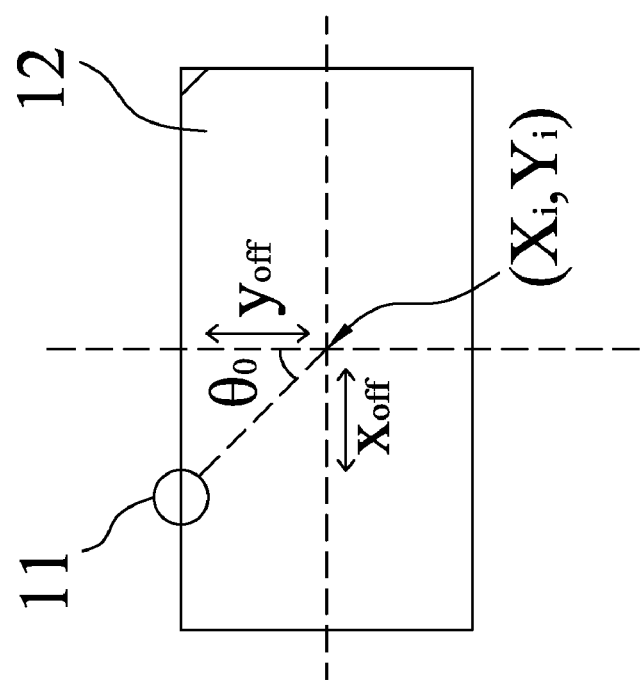
FIG. 1

101 — PROVIDE AN OBJECTIVE FUNCTION IN CARTESIAN COORDINATE FOR REPRESENTING THE POSITION OF EACH MOVABLE INSTANCE AND IN POLAR COORDINATE FOR REPRESENTING THE ORIENTATION OF EACH ROTATABLE MACRO RELATIVE TO ITS CENTER.

102 — MOVE EACH INSTANCE BY DETERMINING NEW POSITION OF THE INSTANCE ACCORDING TO CURRENT POSITION OF THE INSTANCE AND ITS DIRECTION BY CONJUGATE GRADIENT METHOD TO MINIMIZE THE TOTAL WIRELENGTH.

103 — ROTATE EACH ROTATABLE MACRO BY DETERMINING ITS NEW ORIENTATION OF THE MACRO ACCORDING TO CURRENT ORIENTATION OF THE MACRO AND ITS ROTATING DIRECTION BY CONJUGATE GRADIENT METHOD TO MINIMIZE THE TOTAL WIRELENGTH.

FIG. 3

HIERARCHY-BASED ANALYTICAL PLACEMENT METHOD CAPABLE OF MACRO ROTATION WITHIN AN INTEGRATED CIRCUIT

CROSS-REFERENCE TO RELATED APPLICATION

This application is a continuation-in-part of U.S. patent application Ser. No. 12/168,288, filed Jul. 7, 2008, now U.S. Pub. No. 2009/0031269, and also claims priority to U.S. Provisional Patent Application No. 61/354,719, filed Jun. 15, 2010, each of which are hereby incorporated herein by reference.

BACKGROUND OF THE INVENTION

1. Field of the Invention

The invention relates in general to algorithms for generating a global placement plan for an integrated circuit, and in particular to an analytical placement algorithm taking into account macro rotation and legalization constraints.

2. Description of the Prior Art

An integrated circuit (IC) designer typically generates a text-based netlist describing an IC as a hierarchy of modules formed by instances of various components (cells) interconnected by signal paths (nets). The nets are formed by conductors residing on various horizontal layers of the IC and by conductive "vias" passing vertically between layers. Longer nets may include buffers when needed for amplifying signals they convey. A netlist is typically hierarchical in nature with cell instances being organized into low level modules and lower level modules being organized into higher level modules. Most cell instances are usually of standard height but varying width, however some cell instances may be large "intellectual property" (IP) modules implementing devices such as memories and microprocessors.

After creating the netlist, the designer employs a computer-aided placement and routing (P&R) tool to produce a global placement plan indicating a position for each cell instance, and to then produce a routing plan describing the routes and positions of conductors, vias and buffers forming the nets that connect the cell instances. When unable to develop a suitable routing plan, the P&R tool will modify the global placement plan and again attempt to develop a suitable routing plan.

Cell instances of standard height are normally aligned in non-overlapping positions in parallel rows. A cell instance is considered to be in a "legal position" if it is properly aligned in one of the rows. Global placement algorithms typically position cells to optimize routability, but they do not concern themselves with placing cells in legal positions and may allow some cell instances to overlap with each other. Therefore after producing a global placement plan, a P&R tool will "legalize" a global placement plan prior to generating a routing plan by moving cell instances to nearby legal positions. The P&R tool then adjusts the legalized placement plan to produce a detailed placement plan by swapping and shifting cell instance positions to reduce the lengths of nets needed to interconnect the cells and the congestion in any area. The P&R tool finally generates a routing plan based on the detailed placement plan.

The ability of a P&R tool to quickly generate a suitable layout depends largely on how well the global placement plan anticipates the routing requirements. When generating a global placement plan, a typical P&R tool will try to position highly-interconnected cell instances close to one another in order to reduce the total length of the nets (the "wirelength") needed to interconnect cell instances, but will also try to distribute the cells in a way that allows sufficient space for routing nets between cells. Thus a global placement plan should provide an adequate balance between positioning cell instances close to one another to reduce wirelength and positioning cell instances farther apart to distribute adequate space throughout the placement area for routing nets. Some P&R tools establish an objective (or "cost") function having cell instance coordinates as independent variables to quantify the routability of a global placement plan. The global placement plan for which the value of the objective function is lowest is considered most likely to be routable. A P&R tool may employ analytical placement algorithms to iteratively adjust the global placement plan, with the algorithm analyzing the global placement plan and the objective function to determine how to reposition cells so as to improve the routability of the placement as indicated by the value of the objective function.

Objective functions typically include a term that increases with the estimated total wirelength because routing becomes more difficult as wirelengths increase. Since a global placement plan can also be unroutable even when wirelengths are short when the plan requires too many nets to pass through the same area of an IC, some "congestion-aware" analytical global placement plans add a routing congestion term to the objective function. A congestion aware placement algorithm divides an IC's placement area into regions and places cells within each region. A routing congestion term can be designed to increase the objective function value as the number of nets that must cross any region boundary increases, thereby discouraging the placement algorithm from generating a global placement plan resulting in excessive routing congestion in any region.

Since during the routing stage of the layout process, a P&R tool may have to add buffers as certain points within the layout to amplify signals passing over the longer nets, a global placement plan should distribute empty space ("white space") throughout the IC in order to accommodate buffers added to the layout during the routing phase. Although a congestion aware placement algorithm tends to distribute white space by spreading cell instances apart, it can still pack some regions too tightly to provide adequate white space for buffer insertions when no routing congestion occurs at the boundaries of those regions.

It is often necessary to place certain cell instances, such as analog blocks, memory blocks, and I/O buffers, in predetermined locations within an IC. Since such "preplaced blocks" act as constraints on positioning cell instances, including preplaced blocks in an IC design makes it more difficult for a placer to find a routable placement, particularly when preplaced blocks are large and numerous. Cells instances of widely varying size and shape can also make placement more difficult.

One drawback to prior art analytical global placement algorithms is that, while the global placement plans are produced with optimized routability as indicated by the objective function, such global placement plans may not be optimal after legalization since a legalization algorithm does not consider the objective function when repositioning cell instances to legal positions. Furthermore, previous works fail to consider orientations for macros mainly due to their incapability of macro orientation handling in the analytical global placement process. Therefore, it is desired to develop effective techniques for macro orientation handling for analytical global placement. Thus what is needed is an analytical placement algorithm to produce a global placement plan for mixed-size cell instances that optimizes post-legalization routability by minimizing total wirelength while taking into account pre-placed instances, white space, macro rotation and legalization constraints.

SUMMARY OF THE INVENTION

One objective of the present invention is to generate a global placement plan specifying positions of cell instances and orientations of macros within an integrated circuit (IC) to improve and minimize total wirelength among all instances by controlling macro rotation.

One embodiment of the present invention is a method for specifying positions of a plurality of instances and the orientation for each rotatable instance thereof within an integrated circuit (IC) by converging total overflow ratio (TOFR) hierarchically, wherein TOFR indicates the degree of instance overlap, and is based on the parameters comprising at least one of the area occupied by moveable instances and the area not occupied by pre-placed instances that is available for accommodating moveable instances.

The method uses a single objective function expressed in Cartesian coordinate to represent the position of each movable instance and in Polar coordinate to represent the orientation of each rotatable macro relative to its center. For each movable instance, determine its new position according to current position of the instance and its direction by conjugate gradient method to minimize the total wirelength; for each rotatable macro, determine its new orientation according to current orientation of the macro and its rotating direction by conjugate gradient method to minimize the total wirelength.

The present invention discloses that each macro is rotated to a desired orientation by a combination of the rotation force and the Cross Potential Model, in which the rotation force is generated according to the direction by taking the gradient of the objective function on the orientation of a macro instance, and the Cross Potential Model calculates the density distribution in the original position and the rotated position of the macro respectively. Consequently, each macro is rotated to a legal orientation at the end of global placement according to the density distribution.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

FIG. 1 is a perspective illustration of the original position and the rotated position of a macro.

FIG. 3 is a simplified flow chart to illustrate the movement of instances and rotation of macros in a global placement.

DETAILED DESCRIPTION OF THE INVENTION

Figure 2:
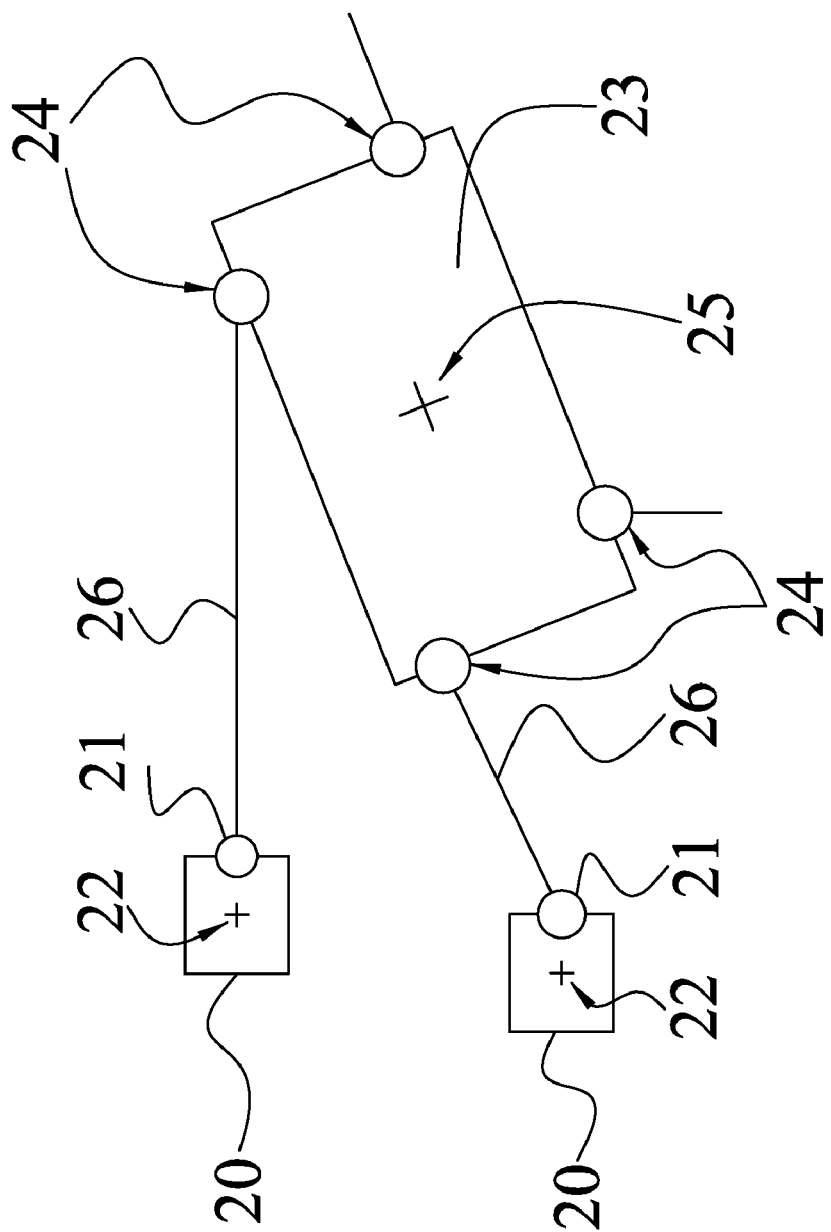
FIG. 2 is a perspective illustration of movement of instances and rotation of macros in a global placement

The invention relates to a method for generating a global placement plan specifying positions of cell instances and orientations of macros within an integrated circuit (IC). In particular, how to move and rotate the macros is described.

To make the following description clear in the present invention, some words inclined to be confusing are defined in the beginning A macro means circuit design of relatively larger size such as static or dynamic memory, which is capable of being moved and rotated during the placement. A cell instance means circuit design of smaller size such as transistors or logic gates. The word "instance" is a global term to represent either a cell instance or a macro instance in the lowest level of hierarchy, or a component block in a level other than the lowest level of hierarchy.

In the abovementioned U.S. patent application Ser. No. 12/168,288, to which the instant application claims the benefit, an objective function consisting of a wirelength term $W(x, y)$ and a density term $D_b'(x, y)$ is used to characterize the routability of a global placement plan and is an index to judge minimum of the total wirelength interconnected among all instances, in which the position of each instance is defined as central location of the instance, and the conjugate gradient method calculates the gradient at central location of the instance to minimize the total wirelength interconnected among all instances.

In one embodiment of the present invention, the conjugate gradient method also calculates the gradient of macro orientation to minimize the total wirelength interconnected among all instances. Because orientation path of a pin of a macro is substantially defined as being circular, using Polar coordinate $(r, \theta)$ in the objective function to define each pin's location of the macro is more convenient than using Cartesian coordinate $(x,y)$. FIG. 1 is a perspective illustration of the original position and the rotated position of a macro. A macro 12, a pin 11 connected to the macro 12, the initial degree $\theta_0$ and the rotation degree $\theta$ of macro are illustrated. With rotation degree $\theta$, the position of the pin of the macro can be easily derived. The distance between the original position of the pin of the macro $(x_i+x_{off}, y_i+y_{off})$ and the macro-center 14 location $(x_i, y_i)$ is the offset $(x_{off}, y_{off})$. Macro center 14 is used as the pivot of the macro rotation; if the macro is rotated counterclockwise by $\theta$, the new position of the pin $(x_k, y_k)$ is given by $$\begin{cases} x_k = x_i + x_{off}\cos\theta - y_{off}\sin\theta \\ y_k = y_i + x_{off}\sin\theta + y_{off}\cos\theta, \end{cases} \quad (1)$$

which is substituted for Cartesian coordinate $(x, y)$ in the objective function. Gradient of the objective function is taken with regard to the variable $\theta$ to determine the rotating angle of the macro while the macro is rotating. As a result, the pin's location of the macro varies with the rotation degree $\theta$ of the macro, and thus affects the total wirelength. Please note that the position of each pin of a macro can be converted back to Cartesian coordinate only in order to calculate the total wirelength $W(x, y)$ of all nets e of the set E of all nets interconnecting pins when it is appropriate.

The equations described in the abovementioned U.S. patent application Ser. No. 12/168,288 still hold considering all the pins' locations are in Cartesian coordinate only when all the pins' locations of the macros are converted back to Cartesian coordinate; the equations includes:
total wirelength W(x, y) of all nets e of the set E of all nets interconnecting pins k positioned at coordinates $(x_k, y_k)$ is determined in accordance with:

$$W(x, y) = \gamma \sum_{e \in E} \left( \log \sum_{v_k \in e} \exp(x_k/\gamma) + \log \sum_{v_k \in e} \exp(-x_k/\gamma) + \log \sum_{v_k \in e} \exp(y_k/\gamma) + \log \sum_{v_k \in e} \exp(-y_k/\gamma) \right),$$

wherein $\gamma$ is a constant; and alternatively,
total wirelength W(x, y) of all nets e of the set E of all nets interconnecting pins k positioned at coordinates $(x_k, y_k)$ can also be determined in accordance with:

$$W(x, y) = \sum_{e \in E} \left( \left( \sum_{v_k \in e} (x_k)^p \right)^{1/p} - M_x + \left( \sum_{v_k \in e} (M_x - x_k)^p \right)^{1/p} + \left( \sum_{v_k \in e} (y_i)^p \right)^{1/p} - M_y + \left( \sum_{v_k \in e} (M_y - y_i)^p \right)^{1/p} \right),$$

wherein p is a constant, wherein each pin k has coordinates $x_k>0$ and $y_k>0$, wherein $M_x$ is a constant larger than max $(x_k)$ for all pins k,
wherein $M_y$ is a constant larger than max $(y_k)$ for all pins k.

As show in FIG. 2 which illustrates the movement of instances and rotation of macros in a global placement, a cell instance 20 has a pin 21 for wire-connecting 26 and a macro 23 has pins 24 for wire-connecting 26. For instance movement, Cartesian coordinate (x, y) in the objective function is defined as center location 22 and 25 in conjugate gradient method. For macro rotation, polar coordinate (r, θ) in the objective function is defined as macro pin location 24 in conjugate gradient method. Accordingly, an objective function with three variables (x, y, θ) will be defined after considering both positions of moveable instances and orientations of rotatable macros, in which the distance between a pin and its macro center is a constant. In the preferred embodiment of macro rotation, the pin's position $(x_k, y_k)$ is converted to $(x_i, y_i, \theta)$ in the objective function based on the abovementioned equation (1), in which $(x_i, y_i)$ is the position of the macro-center and θ is the orientation of the macro. Therefore, the conjugate gradient method can calculate the gradient (∂f/∂x, ∂f/∂y, ∂f/∂θ) of the objective function to determine the new position and new orientation of the macro at the same time.

Please refer to FIG. 3, the movement of instances and rotation of macros in a global placement within a hierarchical level is achieved by the following steps:
step 101 to provide an objective function in Cartesian coordinate for representing the position of each movable instance and in polar coordinate for representing the orientation of each rotatable macro relative to its center;
step 102 to move each instance by determining new position of the instance according to current position of the instance and its direction by conjugate gradient method to minimize the total wirelength; and
step 103 to rotate each rotatable macro by determining its new orientation of the macro according to current orientation of the macro and its rotating direction by conjugate gradient method to minimize the total wirelength.

The instance movement is described in the abovementioned U.S. patent application Ser. No. 12/168,288, in which a plurality of cells are positioned as described therein. In one embodiment of the present invention, the movement of a macro is operated the same as that of a cell instance by defining the position of the macro as its center location. Therefore, it is not described herein further and only the macro rotation will be described hereafter.

Figure 4:
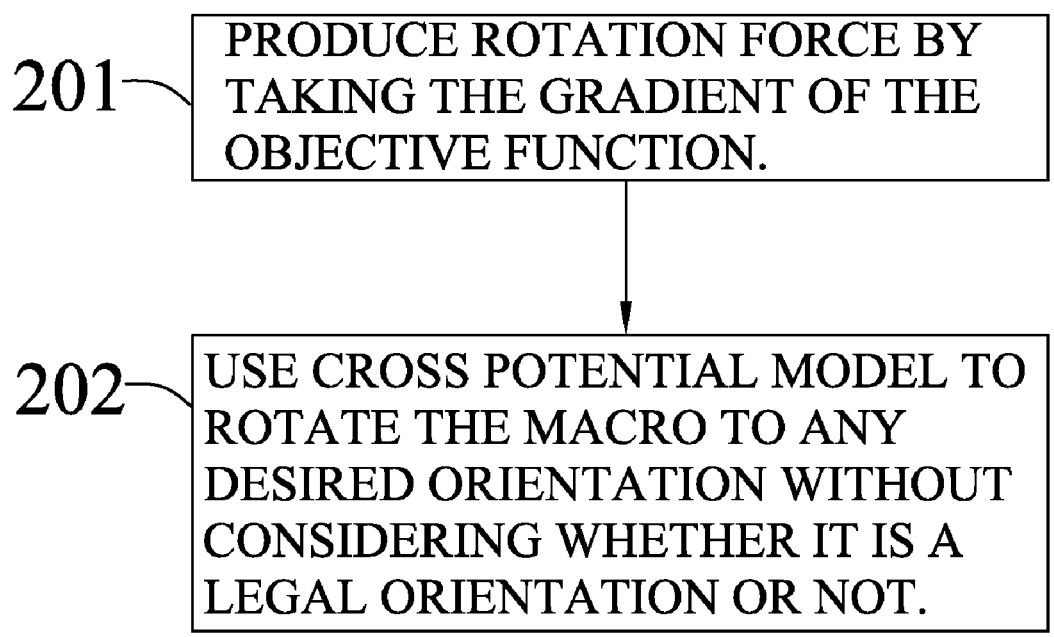
FIG. 4 is a simplified flow chart of the implementation of analytical placement for macro rotation.

Please refer to FIG. 4, which illustrates the macro rotation. In block 201, the placer produces rotation force by taking the gradient of the objective function, in which the rotation force is defined as the gradient of the objective function at the current orientation of the macro.

In block 202, the placer uses Cross Potential Model to rotate the macro to any desired orientation without considering whether it is a legal orientation or not. Each macro is rotated to a desired orientation by a combination of the rotation force and the Cross Potential Model. A legal orientation of each macro is restricted to be either the original position (0° or 180°) or the rotated position (90° or 270°) as shown in FIG. 1. Because any orientation for a rotatable macro during placement is allowed, density distribution of the macro in the original position (0° or 180°) and the rotated position (90° or 270°) are considered and the Cross Potential Model calculates the density distribution of the macro. In the Cross Potential Model, potential projection function is used to represent density contribution in each legal orientation. Potential projections in both 0° (360°) and 180° are treated together and likewise for 90° and 270°.

Figure 5A:
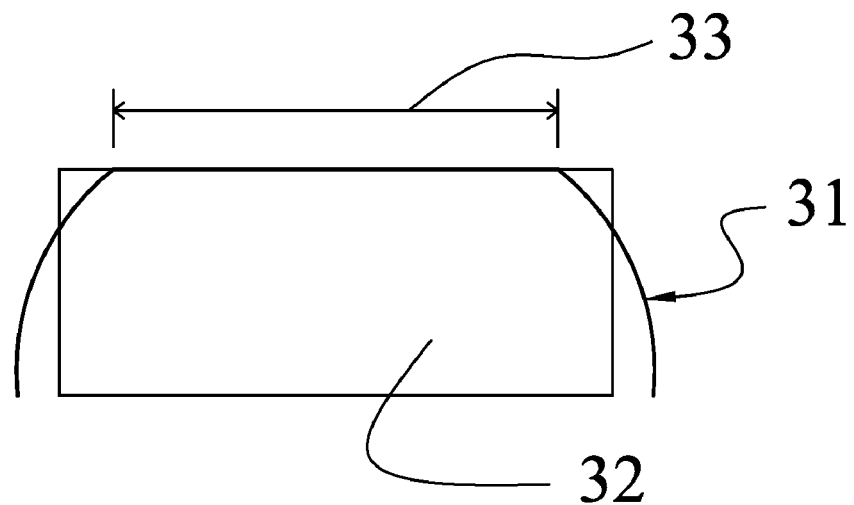
FIGS. 5A and 5B are exemplary diagrams of the potential function in Cross Potential Model.
Figure 5B:
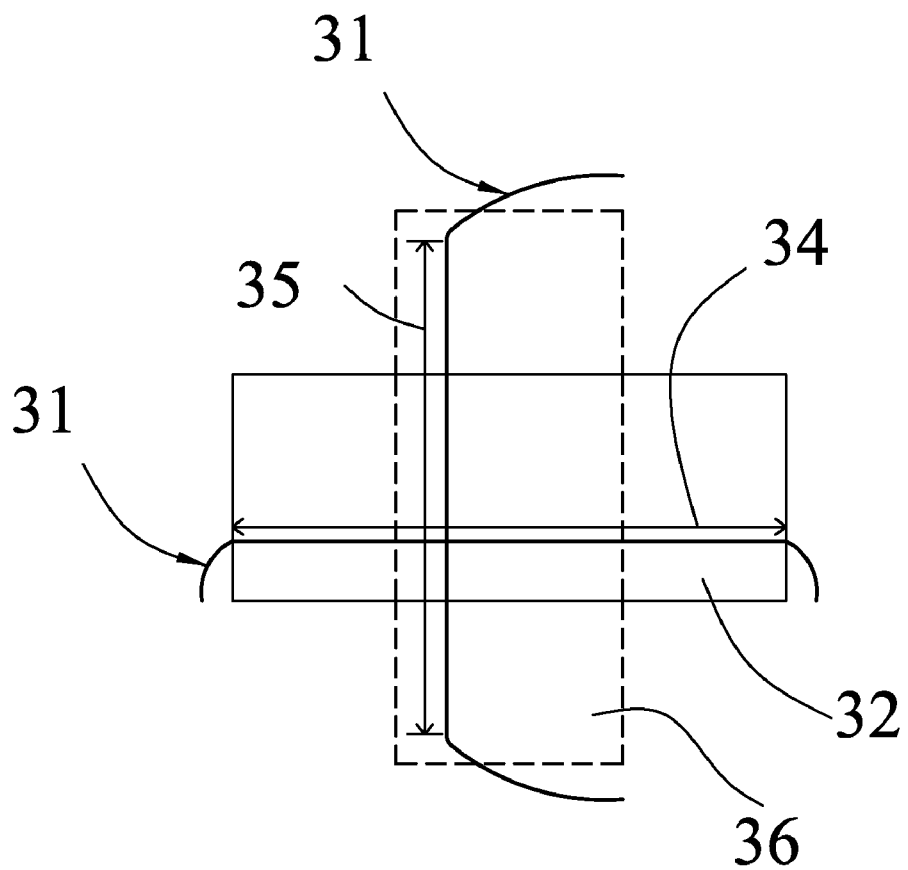
Figure 6A:
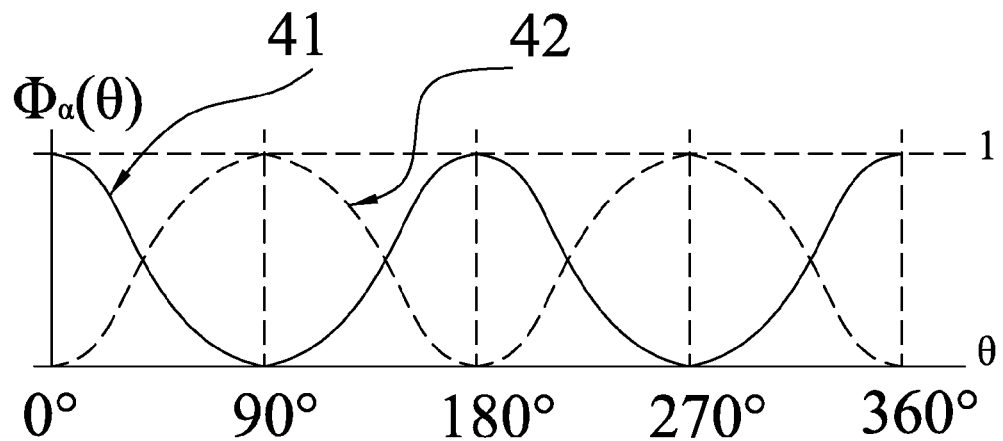
FIGS. 6A and 6B are exemplary diagrams of the potential projections in different directions.
Figure 6B:
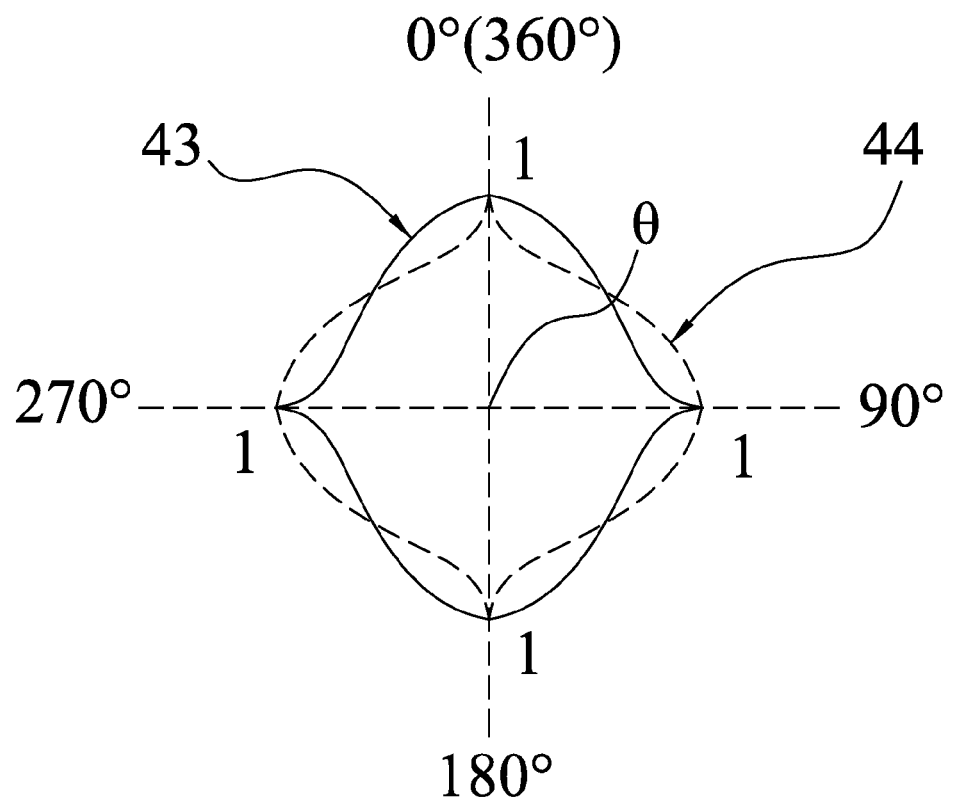

As shown in FIG. 5A, if a macro isn't rotated, the potential function 31 is present in its original position 32 with a 100% potential 33. As shown in FIG. 5B, if a macro is rotated, the potential function 31 has a % potential 34 in the original direction (solid rectangle) 32 and (100-a) % potential 35 in the rotated direction (dashed rectangle) 36. The percentage a is determined by the rotation degree of the macro. To calculate the contribution of a macro in both directions, the potential projection function (2) is defined as follows:

$$\Phi_a(\theta) = \begin{cases} 32\left(\frac{1}{360}|\theta - \alpha| - 0.25\right)^2, & 0.125 < \frac{1}{360}|\theta - \alpha| \le 0.25 \\ 1 - 32\left(\frac{1}{360}|\theta - \alpha|\right)^2, & 0 < \frac{1}{360}|\theta - \alpha| \le 0.125 \\ 0, & \text{otherwise,} \end{cases} \quad (2)$$

where θ is the rotation degree of the macro, and α can be 0°(360°, 90°, 180°, or 270° (0° or 180° means the original direction; 90° or 270° means the rotated direction). The plot of a potential projection function is shown in FIG. 6A and FIG. 6B, where solid lines 41 and 43 are the curves of the potential projections in the original direction and dashed lines 42 and 44 are the potential projections in the rotated direction. A potential projection function has a maximum value of 1 or a minimum value of 0 at each legal direction.

Considering the potential projection in the density term "$D_b'(x, y)$" in the objective function, the Cross Potential Model is derived by substituting the potential projection function (2) into the density term "$D_b'(x, y)$" in the objective function, which is shown as follows:

$$D'_b(x, y) = \sum_{v \in V} c_v((\Phi_{0°}(\theta) + \Phi_{180°}(\theta))p_x(b, v)p_y(b, v) + \quad (3)$$

$$(\Phi_{90°}(\theta) + \Phi_{270°}(\theta))p'_x(b, v)p'_y(b, v),$$

where $p'_x(b, v)$ and $p'_y(b, v)$ are the respective densities in the x and y directions after macro rotation.

In the Cross Potential Model, if any θ is given, potential projection function yields approximate percentage of density contribution in the original position and the rotated position respectively.

In the abovementioned U.S. patent application Ser. No. 12/168,288, TOFR only considers the instance movement and is defined as below: compute an overflow ratio ($OFR_b$) for each bin b, sum $OFR_b$ for all bins to determine a total overflow ratio (TOFR) and determine whether TOFR for any bin is higher than a user-defined value, which by default is 0. The $OFR_b$ of any bin is defined as:

$OFR_b$=max(0, Occupied_Area−Available_Area)/ Available_Area)

and TOFR for all bins is defined as:

$$TOFR = \sum_b OFR_b \text{ for all bins}$$

where the "Occupied_Area" is the area occupied by moveable instances within the bin, and the "Available_Area" is the area of the bin not occupied by pre-placed instances that is available for accommodating moveable instances.

It's straightforward to calculate the occupied area for moveable instances that are not rotatable within a bin. We just have to sum up the portions of the instances that fall within the bin, which are always rectangular. For moveable instances that are also rotatable, the calculation of occupied area is more complicated. Since we allow any angle for rotatable macros during placement, the calculation of occupied area for a rotatable macro within a bin may need complex trigonometric calculations. To simply the calculation, potential projection in the Cross Potential Model will be used. Given any angle, Cross Potential functions yield approximate percentages of area contributions to the horizontal and vertical directions. Using the approximate horizontal and vertical percentages, the center, area, and aspect ratio of a tilted macro, we can compute the macro's occupied area within a bin by summing the approximate vertical overlap and the approximate horizontal overlap.

Figure 7A:
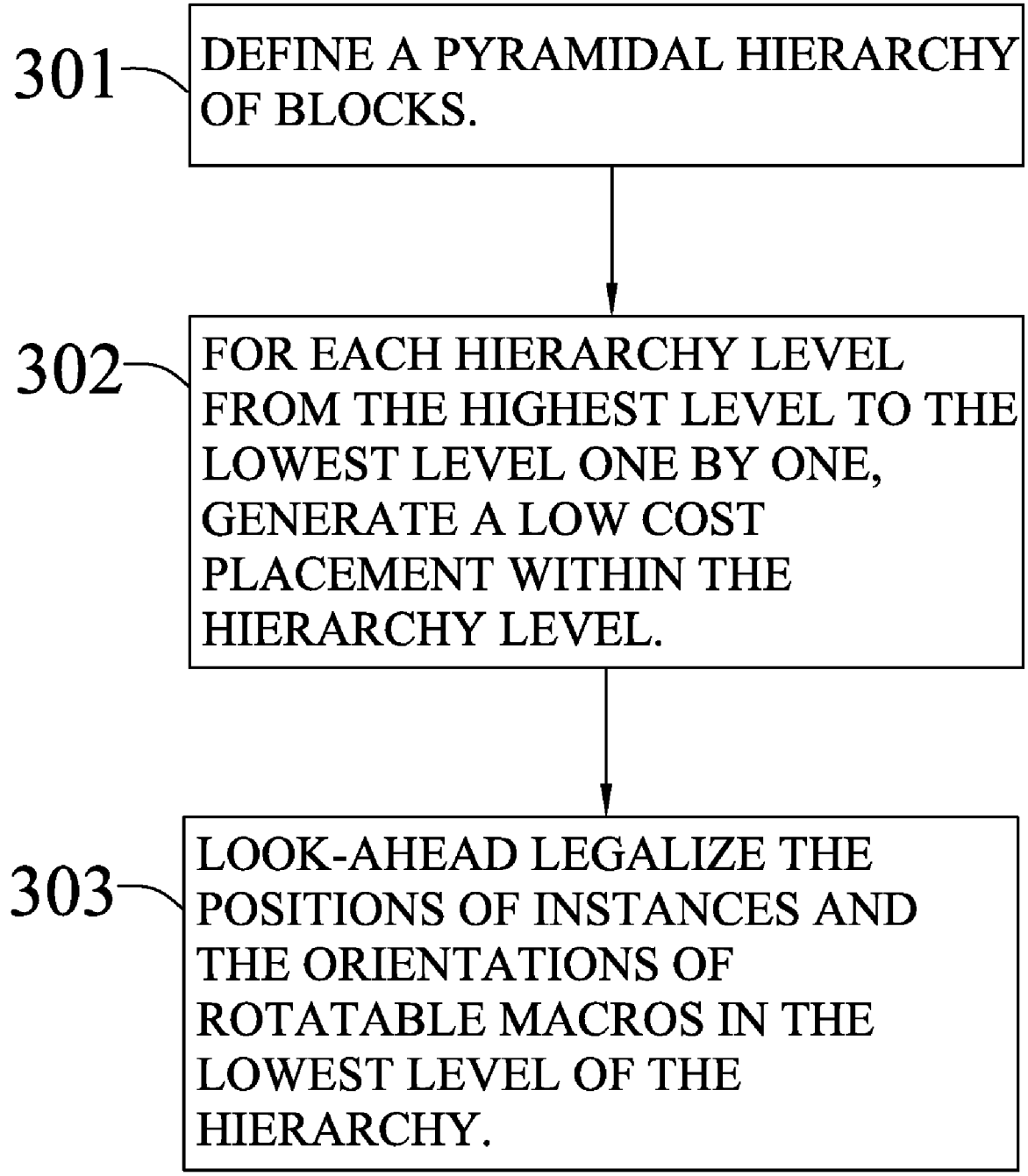
FIG. 7A is simplified flow chart which describes the process for a global placement.

Please refer to FIG. 7A, which is a simplified flow chart which describes the process for a global placement for the whole IC.

In block 301, the placer defines a pyramidal hierarchy of blocks. The parent block residing at the next higher level of the hierarchy comprises a plurality of component block instances or cell instances or rotatable macros residing at current level of the hierarchy. Macros may be clustered as one block in each level of the hierarchy.

In block 302, for each hierarchy level from the highest level to the lowest level one by one, generate a low cost placement within the hierarchy level.

In block 303, look-ahead legalize the positions of instances and the orientations of rotatable macros in the lowest level of the hierarchy.

Figure 7B:
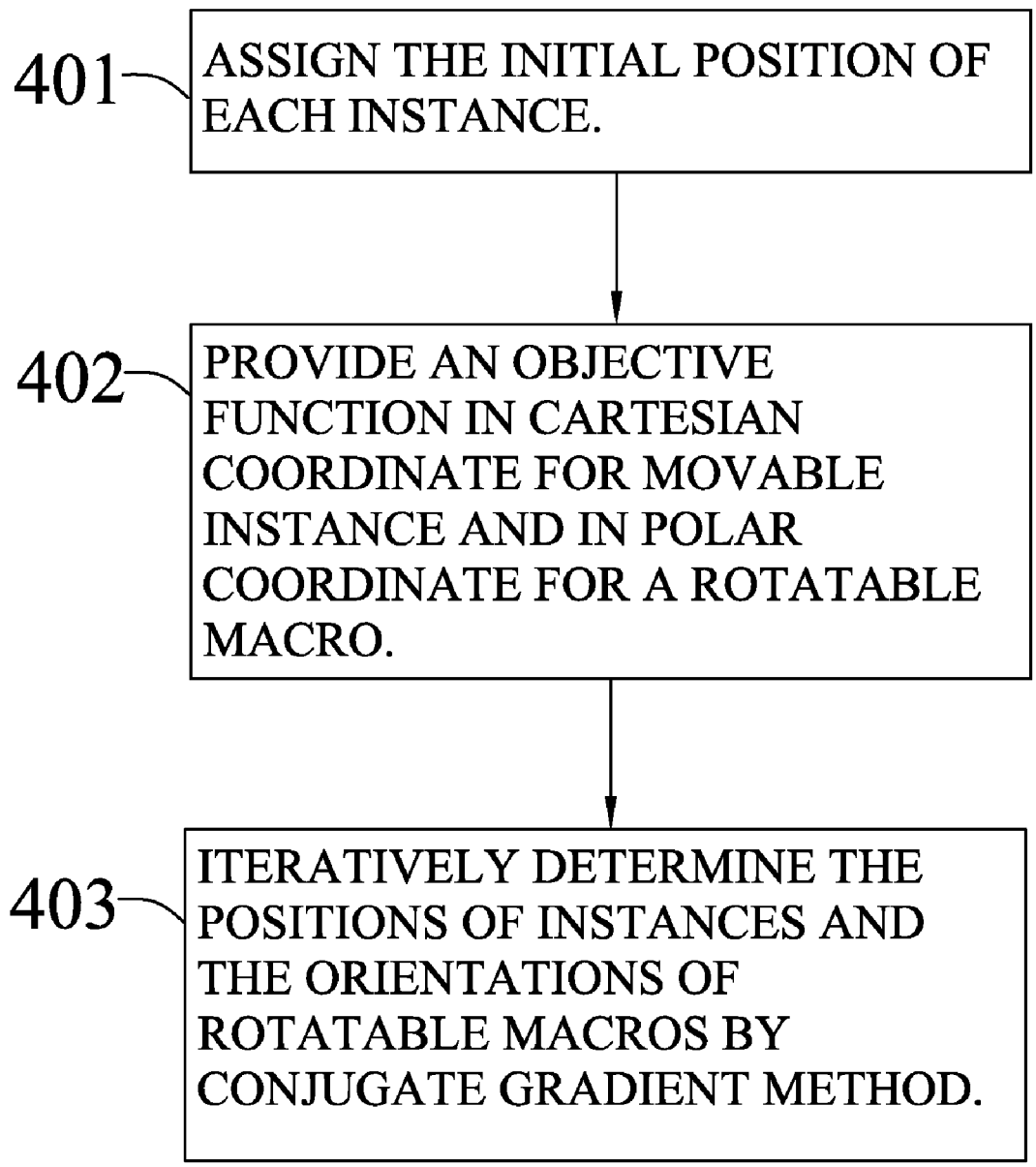
FIG. 7B is a simplified flow chart of block 302 of FIG. 7A.

Please refer to FIG. 7B, which further illustrates the steps in the abovementioned block 302 of FIG. 7A to generate a low cost placement within the hierarchy level. In step 401, assign the initial position of each instance residing at the hierarchy level according to the position of its respective parent block. If the hierarchy level is the highest level, assign the initial position of each instance to a pre-determined position. In step 402, provide an objective function in Cartesian coordinate for representing the position of each movable instance and in Polar coordinate for representing the orientation of a rotatable macro relative to the its center. In step 403, iteratively determine the positions of instances and the orientations of rotatable macros by conjugate gradient method.

In each hierarchy level, the placer uses conjugate gradient method to generate an initial low cost placement. Then the placer checks TOFR to determine whether instances are too concentrated in any area or not. If TOFR doesn't pass, iteratively modify relative weighting of the wirelength term and density term to fine-tune the objective function (maybe increase the effect of density term relative to wirelength term in the objective function) to generate a new low cost placement within the hierarchy level until TOFR passes. If TOFR passes, all instances in the current level are declustered to those in the next lower level and repeat above process until a low cost placement is generated and TOFR passes in the lowest level.

The look-ahead legalization of all instances without considering rotatable macros is described in the abovementioned U.S. patent application Ser. No. 12/168,288. Therefore, it is not described herein further and only the legalization of a rotatable macro in terms of its orientation will be described hereafter.

The following description explains the legalization of a rotatable macro in detail. After look-ahead legalization of all instances, mathematical programming is applied to determine the final orientation of each macro at the end of global placement. As mentioned in block 202 of FIG. 4, the Cross Potential Model is used to rotate the macro to any desired orientation which may not be a legal orientation. However, for a legal placement result, only certain discrete orientations are allowed for macros. Therefore, each macro is rotated to a legal orientation according to its rotation degree at the end of each iteration of global placement. For a macro with a larger contribution on a direction in the Cross Potential Model, it is rotated to the corresponding direction. For macros with ambiguous rotation degrees, such as 45°, mathematical programming is applied to determine the final orientations for these macros.

Figure 8A:
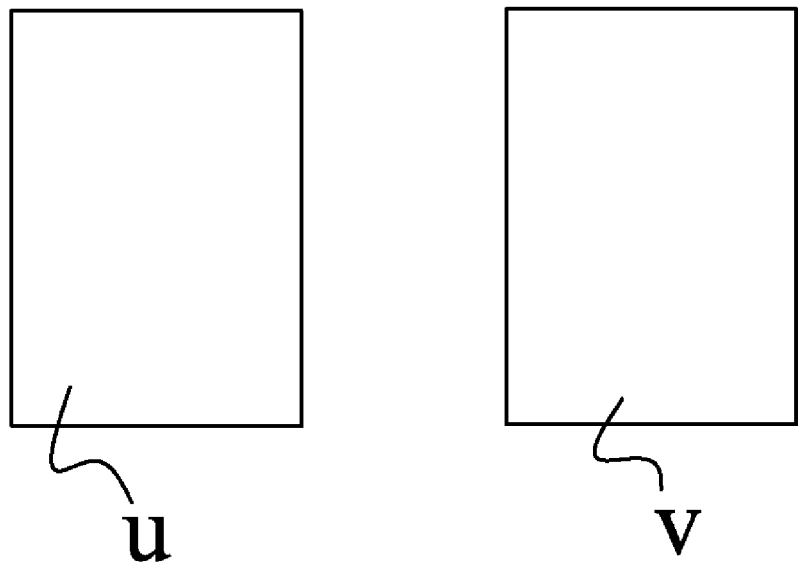
FIGS. 8A, 8B, 8C and 8D are exemplary diagrams of overlap combinations between two macros u and v.
Figure 8B:
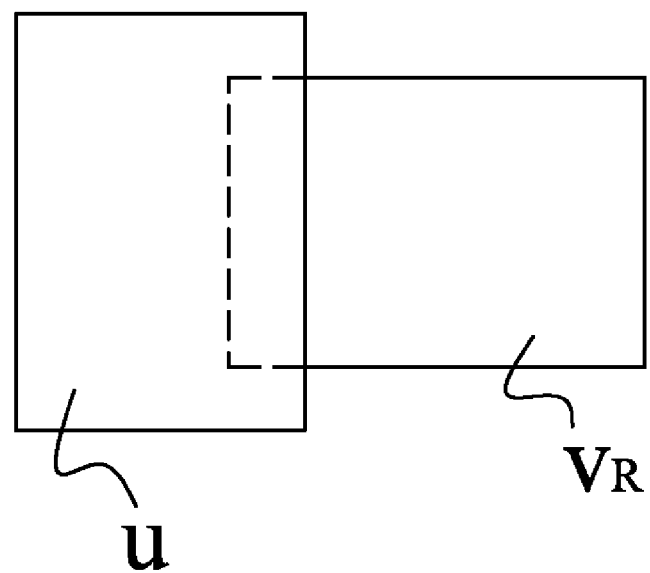
Figure 8C:
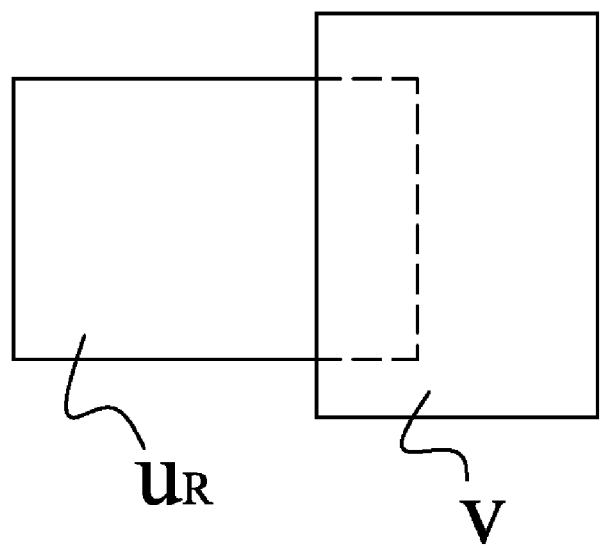
Figure 8D:
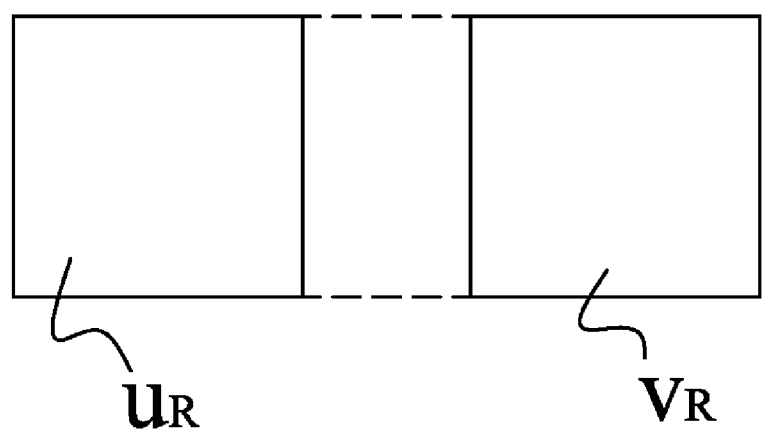

As shown in FIG. 8A to 8D, there are at most four overlap combinations denoted by the dashed line between any two different macros. In FIG. 8A, there is no overlap between one macro in the original position u and the other macro in the original position v. In FIG. 8B, there is overlap between one macro in the original position u and the other macro in the rotated position $v_R$. In FIG. 8C, there is overlap between one macro in the rotated position $u_R$ and the other macro in the original position v. In FIG. 8D, there is overlap between one macro in the rotated position $u_R$ and the other macro in the rotated position $v_R$. The overlap between the two macros u and v is defined by the Ψ function (4) as:

$$\Psi(u,v)=(1-r_u)(1-r_v)\Phi(u,v)+(1-r_u)r_v\Phi(u,v_R)+r_u(1-r_v) \\ \Phi(u,v_R)+r_ur_v\Phi(u_Rv_R) \quad (4)$$

$r_u, r_v \in \{0,1\}$, $r_u$ and $r_v$ are decision variables, $r_u$ or $r_v$=0 if macro u or macro v is rotated by 0° or 180°, $r_u$ or $r_v$=1 if it is rotated by 90° or 270°, and Φ (u, v) is the overlap between macros u and v with given orientations. These four overlap combinations are put together in equation (4), and only one of the combinations can be satisfied at each time. It should be noted that only the orientations of a subset of macros are needed to be determined exactly; for macros with large density contributions on one direction, e.g., more than 80%, its orientation will be fixed.

To further simplify the mathematical programming, the logical AND operation between variables $r_u$ and $r_v$ in equation (4) is transformed to an integer linear programming (ILP) formulation and $r_u, r_v$ is substituted with $$r_{u,v} \leq r_u, r_{u,v} \leq r_v, r_{u,v} \geq r_u + r_v - 1, r_u, r_v, r_{u,v} \in \{0,1\} \quad (5)$$

where $r_{u,v}$ is the logical AND operation between $r_u$ and $r_v$. As a result, final 0-1 ILP formulation for determining macro orientations is shown as follows:

$$\min \sum_{u,v} \begin{pmatrix} (1 - r_u - r_v + r_{u,v})\phi(u, v) + \\ (r_v - r_{u,v})\phi(u, v_R) + \\ (r_u - r_{u,v})\phi(u_R, v) + \\ r_{u,v}\phi(u_R, v_R) \end{pmatrix} \quad (6)$$

s.t.

$$r_{u,v} \leq r_u$$
$$r_{u,v} \leq r_v \ \forall \ u, v$$
$$r_{u,v} \geq r_u + r_v - 1$$
$$r_u, r_v, r_{u,v} \in \{0, 1\} \ \forall \ u, v$$

Figure 9:
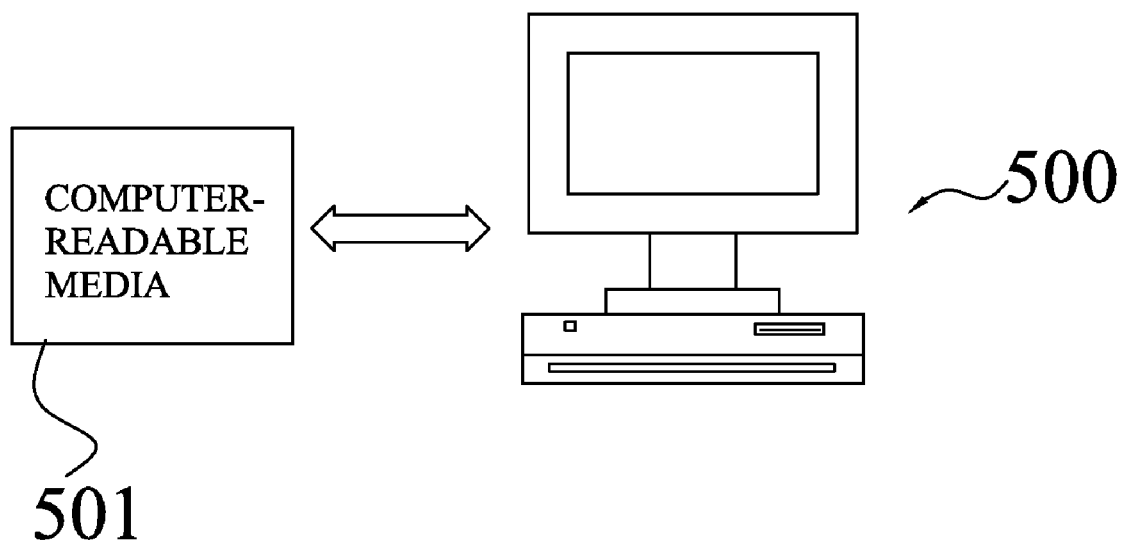
FIG. 9 is an exemplary diagram of conventional computer of the present invention.

The method is suitably implemented by a conventional computer 500 executing software residing on computer-readable media 501 such as, for example, a hard disk, a compact disk, or read only or random access memory, which when read and executed by a conventional computer, causes the computer to carry out the method. FIG. 9 is an exemplary diagram of conventional computer 500 in an implementation consistent with the principles of the invention.

Although there are many ways to practice the invention defined by the claims appended to this specification, the above portion of the specification describes in detail only one particular mode of practicing the invention. Those of skill in the art will appreciate that not all implementation details described below are necessary to practice the invention as recited in the claims. For example other methods for estimating wirelengths and bin density could be employed. The objective function could include other weighted factors related to other placement attributes such as, for example, routing congestion and power distribution.

What is claimed is:

1. A computer-implemented method for specifying positions of a plurality of instances and the orientation for each rotatable instance thereof within an integrated circuit (IC) by converging total overflow ratio (TOFR), wherein TOFR indicates the degree of instance overlap, and is based on the parameters comprising at least one of the area occupied by moveable instances and the area not occupied by pre-placed instances that is available for accommodating moveable instances, the method comprising using a computer to perform the steps of:
   a. defining a hierarchy of blocks, wherein a parent block residing at the next higher level of the hierarchy comprises a plurality of component block instances or cell instances or rotatable instances residing at current level of the hierarchy; and
   b. for each hierarchy level from the highest level to the lowest level one by one, generating a placement within the hierarchy level, further comprising the steps of:
      b1. assigning the initial position of each instance residing at the hierarchy level according to the position of its respective parent block, or by assigning the initial position of each instance to a pre-determined position if the hierarchy level is the highest level;
      b2. providing an initial objective function in Cartesian coordinate for representing the position of each instance and in Polar coordinate for representing the orientation of a rotatable instance relative to the center of the rotatable instance;
      b3. determining the positions of instances and the orientations of rotatable instances by iteratively executing the following sub-steps until the cost of the objective function ceases to decrease, wherein the sub-steps comprise:
         b31. determining new position for each of the plurality of instances according to current position of the instance and the direction taken by the gradient of the objective function with respect to the Cartesian coordinate; and
         b32. determining new orientation for each rotatable instance according to current orientation of the rotatable instance and the rotating direction taken by the gradient of the objective function with respect to the Polar coordinate;
      b4. modifying the objective function according to TOFR if TOFR is not converged to a pre-defined range for the hierarchy level; and
      b5. repeating step b3 and step b4 until TOFR is converged to the pre-defined range for the hierarchy level.

2. The computer-implemented method in accordance with claim 1, wherein the orientation for each rotatable instance is substantially defined as being circular.

3. The computer-implemented method in accordance with claim 1, wherein the IC is divided into a plurality of bins, and the objective function comprises weighted wirelength and bin density terms, wherein the wirelength term is a function of estimated total wirelength of the nets, and the density term is a function of instance density in each bin.

4. The computer-implemented method in accordance with claim 3, wherein a maximum amount of available space $M_b$ is specified within each bin b for accommodating instances, wherein the density term is a function of a difference between areas of instances within each bin b and the specified maximum amount of available space $M_b$ for each bin b.

5. The computer-implemented method in accordance with claim 4, wherein the objective function is modified at step b4 by altering relative weighting of its wirelength and bin density terms.

6. The computer-implemented method in accordance with claim 1, wherein step b31 comprises the sub-steps of:
   b311. determining the direction of each instance; and
   b312. determining the step size of each instance, wherein the step size is dynamically adjusted until the cost of the objective function ceases to decrease.

7. The computer-implemented method in accordance with claim 1, wherein step b further comprises the steps of:
   b6. if the hierarchy level is the lowest hierarchy level, look-ahead legalizing the positions of instances and the orientations of rotatable instances, and computing the total wire length based on the legalized positions and orientations; and
   b7. if the hierarchy level is the lowest hierarchy level, modifying the objective function according to the total wire length and going back to step b3 until the total wire length ceases to decrease.

8. The computer-implemented method in accordance with claim 7, wherein the legalized orientations of rotatable instances in step b6 is determined according to a density contribution in the original direction or in the rotated direction and overlap between any two different rotatable instances.

9. The computer-implemented method in accordance with claim 3, wherein at least one of the instances is a preplaced instance that is constrained to be placed at a particular location within the IC and all other instances are moveable instances each of which may be placed at any of a variety of locations within the IC, and IC is defined as being divided into a plurality of bins, wherein each bin is determined to have at least the specified amount of unoccupied space by computing an overflow ratio (OFR) for that bin and determining the total overflow ratio (TOFR) of all bins is higher than a predetermined minimum value, wherein the OFR of bin b is defined as:
OFR$_b$=max (0, Occupied_Area−Available_Area)/Available_Area) and TOFR for all bins is defined as:

$$TOFR = \sum_b OFR_b \text{ for all bins,}$$

wherein (Occupied Area) is a total area of portions of moveable instances within the bin and the (Available Area) is the area of the bin not occupied by preplaced instances.

10. The computer-implemented method in accordance with claim 3, wherein the weighting of the wirelength and bin density terms is initialized such that the wirelength term has a greater influence on the objective function than the bin density term.

11. The method in accordance with claim 3, wherein the objective function is:

$$f(x, y) = \lambda_1 W(x, y) + \lambda_2 \sum_b (D'_b(x, y) - M_b)^2,$$

wherein $\lambda_1$ and $\lambda_2$ are weighting factors, and W(x, y) is the total wirelength term, $$D'_b(x, y) = \sum_{v \in V} c_v((\Phi_{0°}(\theta) + \Phi_{180°}(\theta))p_x(b, v)p_y(b, v) +$$

$$(\Phi_{90°}(\theta) + \Phi_{270°}(\theta))p'_x(b, v)p'_y(b, v),$$

$$\Phi_\alpha(\theta) = \begin{cases} 32\left(\frac{1}{360}|\theta - \alpha| - 0.25\right)^2, & 0.125 < \frac{1}{360}|\theta - \alpha| \le 0.25 \\ 1 - 32\left(\frac{1}{360}|\theta - \alpha|\right)^2, & 0 < \frac{1}{360}|\theta - \alpha| \le 0.125 \\ 0, & \text{otherwise,} \end{cases}$$

$$p_x(b, v) = \begin{cases} 1 - ad_x^2, & 0 \le d_x \le w_v/2 + w_b \\ b(d_x - w_v/2 - 2w_b)^2, & w_v/2 + w_b \le d_x \le w_v/2 + 2w_b \\ 0, & w_v/2 + 2w_b \le d_x, \end{cases}$$

$$a = 4/((w_v + 2w_b)(w_v + 4w_b)),$$

$$b = 2/(w_b(w_v + 4w_b)),$$

$d_x$, $d_y$ are orthogonal x and y direction distances between a center of a rotatable instance v and a center of bin,
$w_b$ is a width of bin b,
$w_v$ is a width of the rotatable instance v,
$c_v$ is a constant for the rotatable instance v,
$p'_x(b, v)$ and $p'_y(b, v)$ are the respective densities in the x and y directions after rotation for the rotatable instance v,
$\theta$ is the rotation degree of the rotatable instance v, and
$\alpha$ is the legalized orientation of the rotatable instance v.

12. The computer-implemented method in accordance with claim 11, wherein the total wirelength W(x, y) of all nets e of the set E of all nets interconnecting pins k positioned at coordinates ($x_k$, $y_k$) is determined in accordance with $$W(x, y) = \gamma \sum_{e \in E} \left( \log \sum_{v_k \in e} \exp(x_k/\gamma) + \log \sum_{v_k \in e} \exp(-x_k/\gamma) + \log \sum_{v_k \in e} \exp(y_k/\gamma) + \log \sum_{v_k \in e} \exp(-y_k/\gamma) \right),$$

wherein $\gamma$ is a constant.

13. The computer-implemented method in accordance with claim 11, wherein total wirelength W(x, y) of all nets e of the set E of all nets interconnecting pins k positioned at coordinates ($x_k$, $y_k$) is determined in accordance with:

$$W(x, y) = \sum_{e \in E} \left( \left( \sum_{v_k \in e} (x_k)^p \right)^{1/p} - M_x + \left( \sum_{v_k \in e} (M_x - x_k)^p \right)^{1/p} + \left( \sum_{v_k \in e} (y_i)^p \right)^{1/p} - M_y + \left( \sum_{v_k \in e} (M_y - y_i)^p \right)^{1/p} \right),$$

wherein p is a constant, wherein each pin k has coordinates $x_k > 0$ and $y_k > 0$, wherein
$M_x$ is a constant larger than max ($x_k$) for all pins k,
wherein $M_y$ is a constant larger than max ($y_k$) for all pins k.

14. The computer-implemented method in accordance with claim 6, wherein the step size $\alpha_i$ that instances are to be moved is determined at step b312 in accordance with the expression $\alpha_i = s/\|d_i\|^2$,
wherein s is a constant and $d_i$ is a direction vector indicating the determined directions in which the instance positions are to be moved.

15. The computer-implemented method in accordance with claim 14, wherein $d_i = B_i d_{i-1} - f'(x_i)$, wherein $B_i = \Delta x_i^T (\Delta x_i - \Delta x_{i-1})/\Delta x_{i-1}^T \Delta x_{i-1}$ and f' ($x_i$) is a derivative of the objective function.

16. The computer-implemented method in accordance with claim 1, wherein each rotatable instance is rotated by using its center as pivot.

17. The computer-implemented method in accordance with claim 1, wherein modifying the objective function at step b4 is performed by increasing the effect of density term relative to wirelength term in the objective function.

18. The computer-implemented method in accordance with claim 7, wherein a portion of the plurality of instances with larger size is first look-ahead legalized.

19. A non-transitory computer readable media encoded with computer executable instructions to perform a computer-implemented method of claim 1.

20. The computer-implemented method in accordance with claim 1, wherein the area occupied by rotatable instances is calculated according to a density contribution in the original direction or in the rotated direction.

* * * * *